(12) United States Patent
Johnston et al.

(10) Patent No.: US 8,129,226 B2
(45) Date of Patent: Mar. 6, 2012

(54) POWER LEAD-ON-CHIP BALL GRID ARRAY PACKAGE (75) Inventors: James P. Johnston, Austin, TX (US); Chu-Chung Lee, Round Rock, TX (US); Tu-Anh N. Tran, Austin, TX (US); James W. Miller, Austin, TX (US); Kevin J. Hess, St. Ismier (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/599,625

(22) PCT Filed: May 10, 2007

(86) PCT No.: PCT/IB2007/052711
§ 371 (c)(1),
(2), (4) Date: Nov. 10, 2009

(87) PCT Pub. No.: WO2008/139273
PCT Pub. Date: Nov. 20, 2008

(65) Prior Publication Data
US 2010/0270663 A1    Oct. 28, 2010

(51) Int. Cl.
H01L 21/44    (2006.01)
(52) U.S. Cl. ......... 438/123; 438/106; 438/124; 438/127
(58) Field of Classification Search ................. 438/106, 438/123, 124, 127
See application file for complete search history.

(56) References Cited

U.S. PATENT DOCUMENTS

| | | | |
|---|---|---|---|
| 5,060,052 A | 10/1991 | Casto et al. | |
| 5,235,207 A | 8/1993 | Ohi | |
| 5,455,200 A | 10/1995 | Bigler et al. | |
| 5,514,912 A | 5/1996 | Ogashiwa | |
| 5,631,191 A | 5/1997 | Durand et al. | |
| 5,719,748 A | 2/1998 | Cullinan | |
| 5,872,403 A | 2/1999 | Bowman et al. | |
| 6,083,772 A | 7/2000 | Bowman et al. | |
| 6,114,751 A | 9/2000 | Kumakura et al. | |
| 6,319,755 B1 | 11/2001 | Mauri | |
| 6,784,525 B2 | 8/2004 | Kuan et al. | |
| 6,836,009 B2 | 12/2004 | Koon et al. | |
| 7,550,318 B2 | 6/2009 | Hess et al. | |
| 2004/0018317 A1 | 1/2004 | Heinrich et al. | |
| 2004/0183174 A1 | 9/2004 | Huang | |
| 2008/0146010 A1 | 6/2008 | Hosseini et al. | |
| 2008/0246165 A1 | 10/2008 | Hess et al. | |

FOREIGN PATENT DOCUMENTS

| | | |
|---|---|---|
| DE | 4430050 A1 | 2/1996 |
| EP | 0594299 A | 4/1994 |
| WO | WO 2005/010989 A1 | 2/2005 |
| WO | WO 2006/020822 A2 | 2/2006 |

OTHER PUBLICATIONS

International Search Report and Written Opinion for PCT/IB2007/052711, dated Nov. 22, 2007. English translation of Office Action from China Patent Office mailed Jul. 6, 2011 in corresponding Chinese Application No. 200780052927.8.
Applicant's Letter of Aug. 24, 2011 regarding Office Action from China Patent Office mailed Jul. 6, 2011 in corresponding Chinese Application No. 200780052927.8.

*Primary Examiner* — Long Pham

(57) ABSTRACT

A packaging assembly (30), such as a ball grid array package, is formed which distributes power across an interior region of an integrated circuit die (52) by using an encapsulated patterned leadframe conductor (59) that is disposed over the die (52) and bonded to a plurality of bonding pads (45) formed in a BGA carrier substrate (42) and in the interior die region, thereby electrically coupling the interior die region to an externally provided reference voltage.

17 Claims, 4 Drawing Sheets

POWER LEAD-ON-CHIP BALL GRID ARRAY PACKAGE

BACKGROUND OF THE INVENTION

1. Field of the Invention

The present invention is directed in general to the field of semiconductor devices. In one aspect, the present invention relates to electronic component packaging.

2. Description of the Related Art

As the density and complexity of integrated circuit devices increases and the size of such devices shrinks, significant challenges are posed in the design and packaging of these devices. One challenge is that more and more power and signal lines must be electrically connected to the integrated circuit die as the circuit complexity increases, though there is less and less space to allow for such connection as the device sizes shrink. Another challenge is that the conventional approaches for electrically connecting signal and power to the integrated circuit die—such as bonding lead-on-chip (LOC) or tape automated bonding (TAB) leadframe conductors to the die area—are simply not a viable solution for connecting the number of signal and power lines required by today's devices, given the relatively large and unwieldy size of such conductors in comparison to the die size. Such conventional approaches also present packaging challenges in protecting the integrated circuit die from structural or mechanical damage, such as can be caused by moisture or other environmental exposure when leadframe conductors extend through the protective packaging in order to make electrical contact to the outside world.

Figure 1:
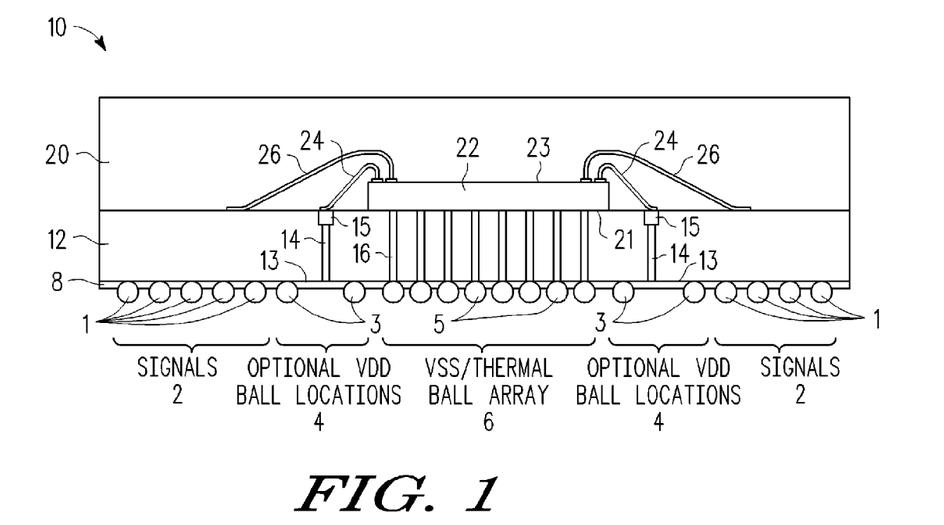
FIG. 1 illustrates in simplified schematic form a cross-sectional view of a conventional wirebonded BGA package device.
Figure 2:
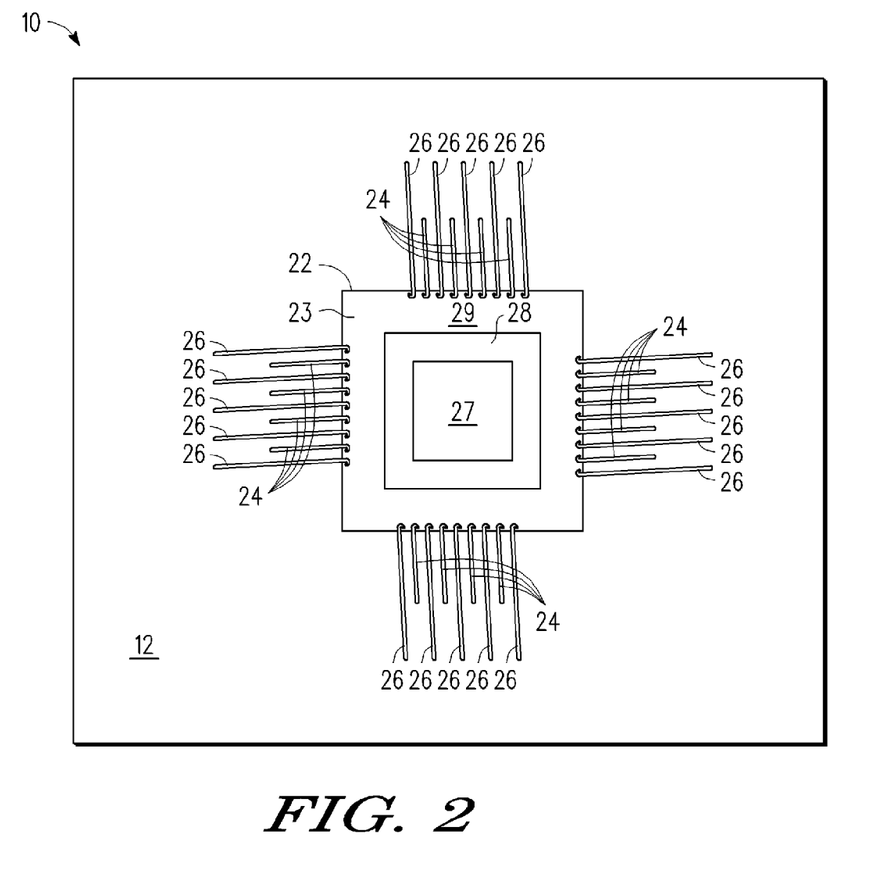
FIG. 2 illustrates a simplified plan view of the package device depicted in FIG. 1.

The electronics industry has attempted to increase the density of die contacts as the number of signal and power lines has increased by using wirebond connection techniques, and has also adopted new types of packaging—such as the ball grid array (BGA), the land grid array (LGA), and the pin grid array (PGA) packages—in order to provide improved device protection and to reduce the package profile. However, these wirebond packaging solutions very often deliver power unevenly to the entire die since the power lines are wirebonded to peripheral bonding pads arrayed on all sides of the active or face surface 23 of the die 22, as illustrated in FIGS. 1 and 2. In particular, FIG. 1 depicts in simplified schematic form a cross-sectional view of a conventional wirebonded BGA package device 10 in which an integrated circuit die 22 (having a back surface 21 and active surface 23) is mounted or attached to a carrier substrate 12 and encased in an insulating package body 20. The solder balls are affixed to a lower surface of the carrier substrate 12 using a solder ball mounting layer 8 which physically attaches and electrically connects each solder ball to a conductive circuit in the carrier substrate. In the package 10, a first reference voltage (e.g., Vss) is supplied to the back surface 21 of the die 22 through electrically conductive paths, such as the $V_{SS}$/thermal solder ball array 5 and the conductive traces 16. In addition, a second reference voltage (e.g., $V_{DD}$) is supplied to a peripheral edge of the active surface 23 of the die 22 through electrically conductive paths, such as the $V_{DD}$ solder ball(s) 3, conductive trace(s) 13, vias 14, contact pad 15 and $V_{DD}$ wirebond conductor(s) 24. Lastly, signal information 2 applied to the signal solder balls 1 is electrically connected to a peripheral edge of the active surface 23 of the die 22 through electrically conductive paths, such as wires, contact pads or layers, conductive vias, conductive traces (not shown) formed in a carrier substrate 12 and the signal wirebond conductor(s) 26. In addition to the electrical connection through the back surface 21 of the die 22, $V_{SS}$ information 6 applied to the $V_{SS}$ solder balls 5 is electrically connected to a peripheral edge of the active surface 23 of the die 22 through electrically conductive paths, such as wires, contact pads or layers, conductive vias, conductive traces formed in a carrier substrate 12 and the $V_{SS}$ wirebond conductor(s) (not shown).

With the $V_{DD}$ wirebond conductor(s) 24 being affixed to bonding pads at the periphery of the die 22, power is not delivered uniformly across the active surface 23 of the die 22. This may be illustrated with reference to FIG. 2 which depicts a simplified plan view of the package device 10 depicted in FIG. 1 in which the power or voltage supplied at a central region 27 and/or interior region 28 is reduced as compared to the power or voltage supplied at the peripheral region 29. The voltage drop or power sag in the interior regions 27, 28 results from the fact that the voltage is strongest in the peripheral region 29 where the $V_{DD}$ wirebond conductor(s) 24 are connected to the die 22. The problem of power loss can be especially acute with low power devices using conventional wirebond packaging. For example, with products in the 5-8 watt range, every milli-volt of voltage degradation over the area of a particular power domain can result in performance and/or yield loss. Such voltage drops can impair the performance of high speed CMOS digital logic (e.g., above 600 Mhz) located in areas that are more than approximately 2 mm from a package level supply terminal. Though flip-chip packaging can provide excellent power distribution, its costs are usually higher than wire bond packages and can limit its application space.

Accordingly, there exists a need for an array packaging scheme that provides improved power distribution for an integrated circuit die having multiple signal and power lines. In addition, there is a need for a cost effective semiconductor device package that electrically connects signal and power lines to an integrated circuit die without impairing device performance or yield. There is also a need for improved packaging processes and devices to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description of a preferred embodiment is considered in conjunction with the following drawings, in which.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A method and apparatus are described for encapsulating a semiconductor die in a package in which an encapsulated leadframe structure is bonded and connected to an integrated circuit die so as to distribute power and/or ground to die level bond pads distributed across the die area. In addition to improving power distribution across the die area, the encapsulated leadframe structure also provides additional contact areas at the periphery of the die for wirebonded signal lines. The leadframe structure is electrically connected to an off-chip power and/or ground supply through electrically conductive paths formed in a carrier substrate (e.g., solder balls, conductive traces, vias, contact pads). In addition, the leadframe structure is formed from one or more patterned conductor layers that are disposed over the integrated circuit die area to make electrical contact with an array of power and/or ground supply terminals in the integrated circuit die. To distribute power across the die area, the leadframe structure is patterned to define a plurality of leads having proximal ends, where each proximal end is positioned or aligned for electrical connection to a corresponding power and/or ground supply terminals in the integrated circuit die in the final package assembly. In various embodiments, the patterned leadframe structure is electrically connected to the power and/or ground grid of the integrated circuit die with an array of short, low profile robust wirebonds distributed across the die area. In other embodiments, one or more layers of the patterned leadframe structure are electrically connected to the power and/or ground grid of the integrated circuit die with conductive die attach techniques, such as conductive adhesive, solder, thermocompression or thermosonic bonding techniques. Whether implemented with one or more patterned conductor layers, the leadframe structure is positioned to be contained completely within the BGA substrate boundaries so that no leadframe conductive layers extend to the product component outer surface. With the power and/or ground supplies distributed across the die area using the patterned leadframe structure, signal lines may be electrically connected to the integrated circuit die using conventional wirebonding techniques, thereby increasing the density of signal line connections in the package.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a packaged semiconductor device which are not drawn to scale and which do not include every device feature or geometry in order to avoid limiting or obscuring the present invention. It is also noted that, throughout this detailed description, certain packaging components (such as the patterned leadframe structure and wirebond conductors) will be formed and assembled to fabricate the packaged semiconductor device. Where the specific procedures are not detailed below, conventional techniques to one skilled in the art for forming and assembling such components may be used. Such details are well known and not considered necessary to teach one skilled in the art of how to make or use the present invention.

As explained herein, a patterned leadframe power conductor is positioned and encapsulated within a wirebonded BGA package device to deliver power and/or ground voltages to multiple die level power terminals distributed across the active surface of an integrated circuit die. This may be illustrated with reference to FIG. 3, which depicts a cross-sectional view of a wirebonded BGA packaging assembly 30 which includes a single-layer leadframe power conductor 59 for distributing power to a plurality of die level bonding pads distributed across an active surface of an integrated circuit die 52 which is mounted or attached to a carrier substrate 42 and encased in an insulating package body 50. The integrated circuit die 52 may be attached directly to the carrier substrate 42 by using an adhesive layer, a die attach epoxy or other die attach techniques known in the art.

Figure 3:
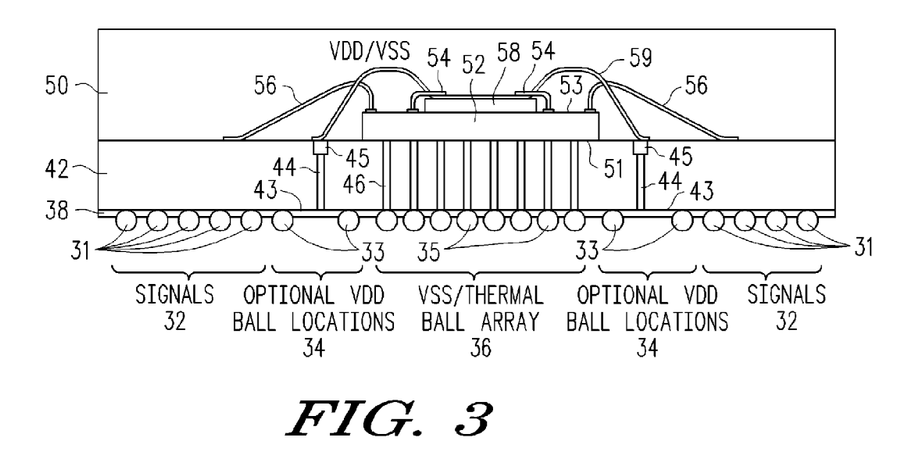
FIG. 3 illustrates a cross-sectional view of a wirebonded BGA package device in which a single layer leadframe provides power to die level bond pads distributed across the die area.

The packaging assembly 30 includes a carrier substrate 42 in which are formed one or more via openings that extend between upper and lower surfaces of the carrier substrate 42. As will be appreciated, the carrier substrate 42 may be formed to any desired shape and thickness, and may include any desired features for use in forming a functional semiconductor package. In addition, the carrier substrate 42 may be fabricated with a relatively thin, flexible film of an electrically insulative material (such as an organic polymer resin), or with a rigid, substantially planar member fabricated from any known, suitable materials, including, but not limited to, insulator-coated silicon, a glass, a ceramic, an epoxy resin, bismaleimide-triazine (BT) resin, or any other material known in the art to be suitable for use as a carrier substrate. A plurality of external conductors or conductive balls, such as conductive solder balls, are affixed to a lower surface of the carrier substrate 42, such as by using a solder ball mounting layer 38 which physically attaches and electrically connects each solder ball to a conductive circuit in the carrier substrate. Each conductive circuit is formed from a conductive pattern of contact pads, traces, vias and package landing areas formed on and through the carrier substrate 42 for purposes of electrically connecting the (subsequently formed) solder balls to the (subsequently attached) integrated circuit die. For example, an external reference voltage (e.g., Vss) may be supplied to the back surface 51 of the die 52 through electrically conductive paths, such as the $V_{SS}$/thermal solder balls 35 and the conductive vias 46. As will be appreciated, one or more internal conductive layers (not shown) may be formed in the carrier substrate 42, though for purposes of simplifying the description, they are represented as a single via 46. These conductive layers may be formed from any conductive material, including but not limited to conductively doped polysilicon, a conductive metal or metal alloy, conductive or conductor-filled elastomer, or any other conductive material used for electrical connections known to those skilled in the art. Finally, individual circuit lines formed on a surface of the carrier substrate (e.g., contact pads or package landings) are electrically separated from one another with selectively formed dielectric layers.

In the packaging assembly 30, the integrated circuit die 52 has a back surface 51 and an active surface 53 in which active circuits are formed. Signal information 32 is electrically connected to the peripheral edge of the active surface 53 of the die 52 through conductive paths (not shown) in the carrier substrate 42 that couple the signal solder balls 31 to the signal wirebond conductor(s) 56, which in turn are bonded to peripheral bonding pads arrayed on all sides of the face surface 53 of the die 52. The use of conventional wirebonding techniques allows multiple signal wirebond conductors 56 to be attached to the active surface 53, thereby increasing the signal line density for the die 52.

Figure 4:
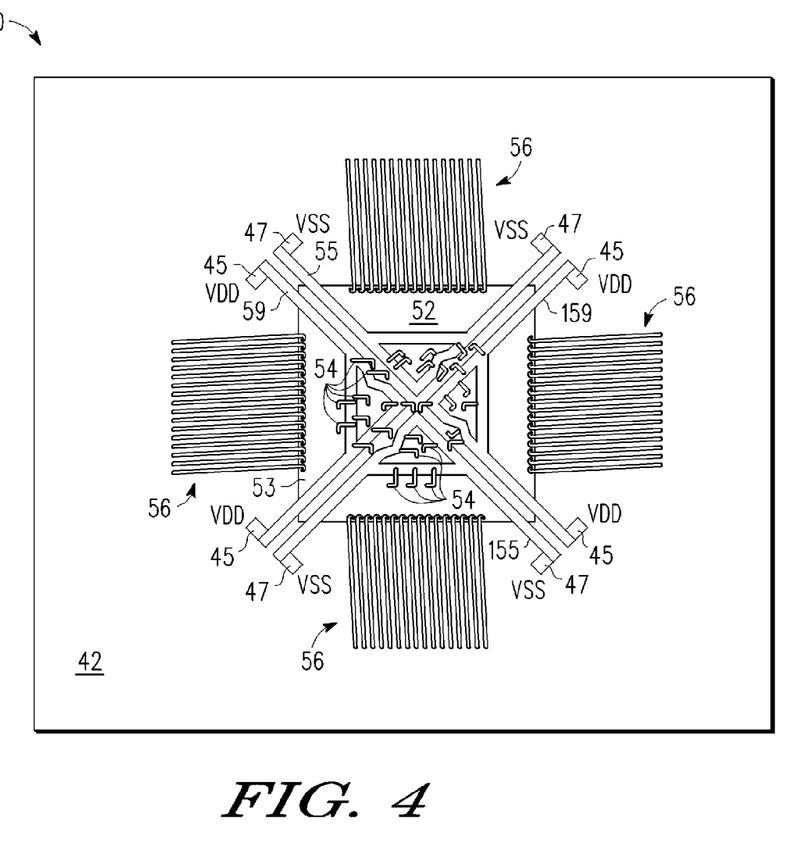
FIG. 4 illustrates a plan view of the package device depicted in FIG. 3.

In addition to signal information, power is supplied to the die 52 through conductive paths formed in the carrier substrate 42. To this end, the depicted packaging assembly 30 includes a single-layer leadframe power conductor 59 which extends across the active surface 53 of the die 52, and is used to supply power to a plurality of bonding pads distributed across the active surface 53 of the die 52. The depicted single-layer leadframe power conductor 59 is physically attached to the die 52 with an electrically non-conductive adhesive layer 58, which may be formed from a thermoplastic poly(siloxane-imide) copolymer or any desired adhesive/bond material. In addition, the single leadframe power conductor 59 is electrically connected to the plurality of bonding pads in the die 52 with a plurality of short, low profile robust wirebonds 54. To support such wirebond connections, the leadframe power conductor includes a plurality of proximal ends or contact regions (shown, for example, in FIG. 4 as the portion(s) of the leadframe power conductor 59 to which the wirebonds 54 are attached) that terminate at bonding ends which are configured for attachment to a plurality of bonding pads located on the face of the integrated circuit die 52. The single-layer leadframe power conductor 59 is also electrically and physically connected to one or more package landings 45 formed in the carrier substrate 42 using any desired technique for making electrical contact, such as using solder, conductive adhesive, thermocompressive bond, thermosonic bond or wirebond. In turn, the package landings 45 are electrically connected through vias 44, conductive trace(s) 43 and solder ball conductors 33 to an external power source (e.g., $V_{DD}$). The power supply solder ball conductors 33 are shown as being affixed in one or more locations 34, though any desired location can be used.

Once the leadframe power conductor 59, integrated circuit die 52 and wirebond conductors are attached to the carrier substrate 42, an encapsulation layer or material 50 may be formed to seal and protect the conductive elements inside the packaging assembly 30 from moisture, contamination, corrosion, and mechanical shock, such as by applying, injecting or otherwise forming a protective layer to seal the open region. For example, a transfer molding compound 50 may be formed over the integrated circuit die 52 using any desired technique to electrically isolate, physically secure and otherwise protect and package the die 52. By positioning the leadframe power conductor 59 to be within the area of the BGA substrate 42, the leadframe power conductor 59 can be completely encapsulated by the insulating package body 50 and thereby protected from potentially damaging environmental conditions. In selected embodiments, the leadframe power conductor 59 is positioned to be substantially within the area of the die 52 so that no part of the power conductor 59 extends through the outer surface of the package body 50. In this position, the leadframe power conductor 59 is bonded and connected to a plurality of die level contact pads on the active surface 53 of the die 52 by means of an array of short low profile robust wirebonds 54.

While only a single leadframe power conductor 59 is shown in the cross-sectional profile of FIG. 3, it will be appreciated that additional leadframe power conductors can also be included in the packaging assembly 30. For example, by forming the single-layer leadframe power conductor 59 with an appropriate pattern which includes one or more open areas, one or more additional single-layer leadframe power conductors can be assembled and attached to extend across portions of the die surface 53 exposed by the open area(s). With these additional power conductors, additional power levels can be supplied to die level bonding pads distributed across the active surface 53 of the die 52 by electrically connecting each power conductor to its corresponding bonding pads with wirebond connectors 54. Indeed, a first power level (e.g., $V_{DD}$) may be supplied from package landing pads 45 using two separate leadframe power conductors 59, 159, each of which is patterned to cover a portion of the active surface 53 of the die 52 (including part of the central or interior regions) and to include open areas that expose other portions of the die surface 53.

In the open areas defined by the first leadframe power conductors 59, 159, a second power level (e.g., $V_{SS}$) may be supplied from package landing pads 47 using two separate leadframe power conductors 55, 155, each of which is patterned to cover a portion of the active surface 53 of the die 52 that is exposed by the leadframe power conductors 59, 159. In addition, each leadframe power conductor 55, 155 is electrically connected to the die level bonding pads via wirebond connectors 54. In the plan view of the packaging assembly 30 depicted in FIG. 4, each of the leadframe power conductors 55, 59, 155, 159 may be formed to have an A-shaped pattern that is positioned to be disposed over a central or interior region of the die surface 53 while allowing space for another leadframe power conductor to be similarly positioned. However, any desired pattern can be used to provide complementary positioning of the leadframe power conductors over the die surface 53. This positioning of leadframe power conductors not only improves the power distribution across the interior die area, but also frees up additional die level contact pads at the periphery of the integrated circuit die 53 so that additional signal lines 56 can be attached using conventional wirebonding techniques. To support such wirebonding connections, each of the leadframe power conductors 55, 59, 155, 159 includes a plurality of proximal ends or contact regions that terminate at bonding ends (shown, for example, in FIG. 4 as the portion(s) of the leadframe power conductors located over the landing pads 45, 47) which are configured for attachment to a plurality of bonding pads located on the face of the integrated circuit die 52. As will be appreciated, any desired assembly technique may be used to affix the leadframe power conductors 55, 59, 155, 159 together or in sequence to the carrier substrate 42 and circuit die 52. For example, one or more of the leadframe power conductors can first be affixed to the respective package landing pads 45, 47 and then wirebonded to the respective plurality of bonding pads located on the face of the integrated circuit die 52, or if desired, the sequence can be reversed.

Figure 5:
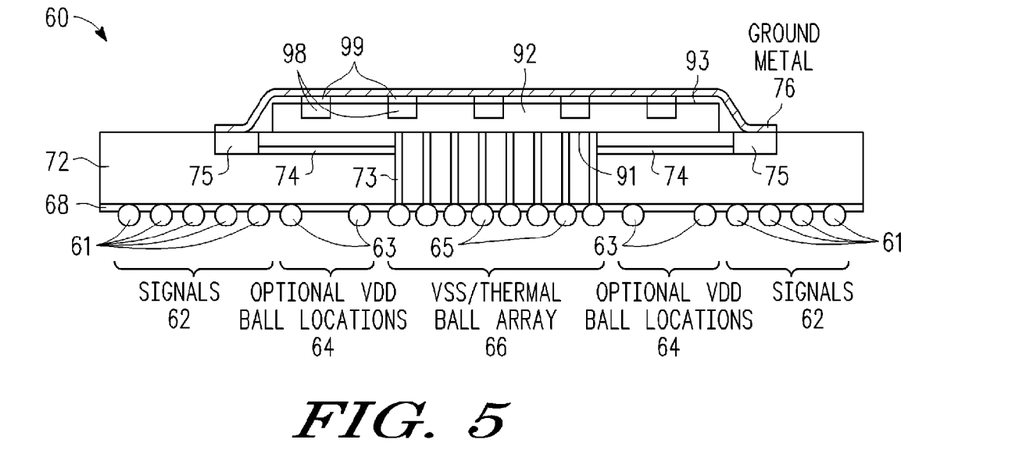
FIG. 5 illustrates a cross-sectional view of a wirebonded BGA package device in which a first layer of a multi-layer leadframe is affixed to a carrier substrate.

While the leadframe power conductors may be implemented with one or more non-overlapping conductive layers as described hereinabove, power distribution advantages may also be obtained by implementing the leadframe power conductor as a dual or multi-layer leadframe conductor for distributing power(s) and/or ground(s) across the die area. An example implementation is depicted in FIG. 5, which depicts a cross-sectional view of a wirebonded BGA packaging assembly 60 at an intermediate stage of assembly where an integrated circuit 92 and first layer 76 of a multi-layer leadframe conductor are affixed to a carrier substrate 72. A plurality of solder balls 61, 63, 65 are affixed to a lower surface of the carrier substrate 72 using a solder ball mounting layer 68 which physically attaches and electrically connects each solder ball to a conductive circuit in the carrier substrate 72. Each conductive circuit may be formed from a conductive pattern of contact pads, traces, vias and package landing areas for electrically connecting the (subsequently formed) solder balls to the (subsequently attached) integrated circuit die. For example, an external reference voltage (e.g., Vss) may be supplied to the back surface 91 of the die 92 through electrically conductive paths, such as the $V_{SS}$/thermal solder balls 65 and the conductive vias 73.

To provide an additional or alternative power supply (e.g., reference voltage Vss) to the active surface 93 of the die 92, the packaging assembly 60 may include a first leadframe power conductor 76 which extends across the active surface 93 of the die 92 and contacts a plurality of bonding pads 98 distributed across the die surface 93. The leadframe power conductor 76 may be formed from one or more conductive layers of leadframe style bulk metal (e.g., copper, gold, copper plated with silver or gold, tin and/or lead, and the like) that provides low loss power distribution at a low cost, such as by selectively etching a conductive layer, stamping or screen printing the leadframe power conductor. The depicted first leadframe power conductor 76 is physically and electrically attached to a plurality of die bonding pads 98 using a corresponding plurality of conductive die attach adhesive layers 99. In addition, the first leadframe power conductor 76 is electrically and physically connected to one or more package landings 75 formed in the carrier substrate 72 using any desired technique for making electrical contact, such as using solder, conductive adhesive, thermocompressive bond, thermosonic bond or wirebond. In turn, the package landings 75 are electrically connected through conductive trace(s) 74, vias 73, and the $V_{SS}$/thermal solder balls 65 to the external power source (e.g., $V_{SS}$).

Figure 6:
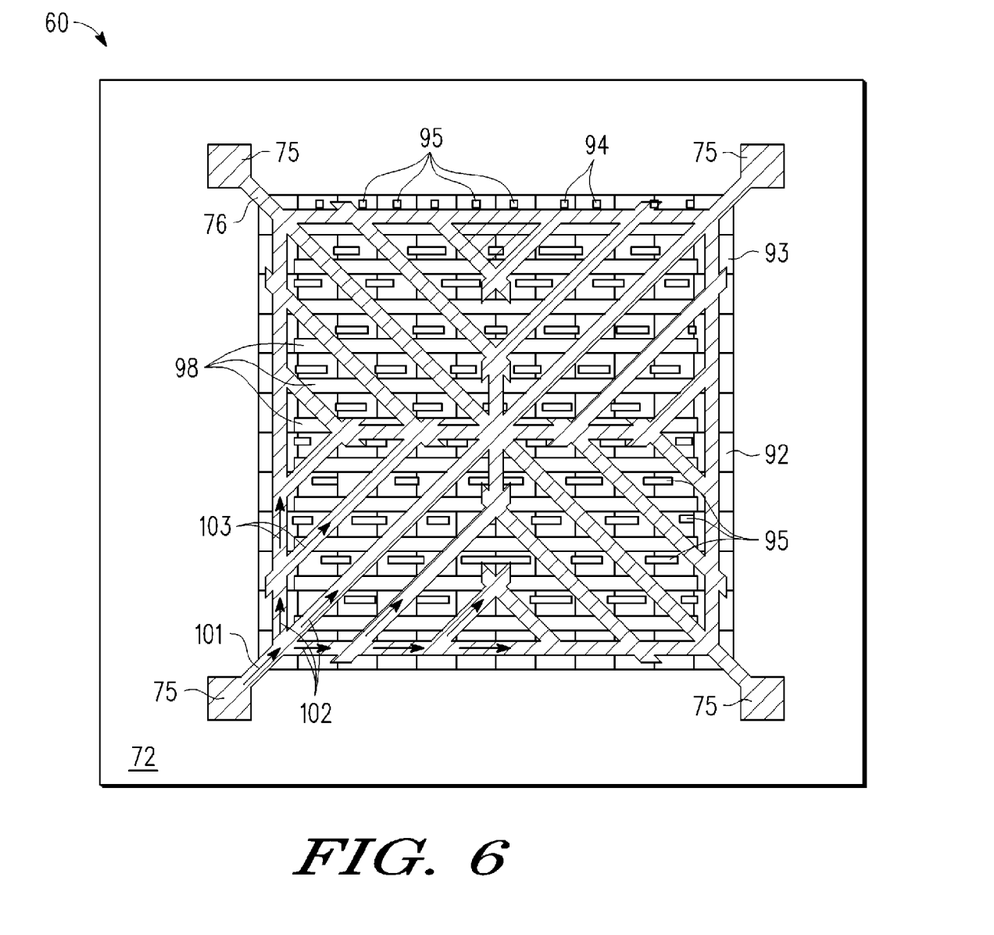
FIG. 6 illustrates a plan view of the package device depicted in FIG. 5.

While the first leadframe power conductor 76 may be electrically connected to die level bonding pads 98 in the die 92 using conductive die attach techniques, any additional leadframe power conductor layers formed over the first leadframe power conductor 76 will typically be connected to its corresponding die level bonding pads using wirebond conductors. To this end, the first leadframe power conductor 76 may be formed with an appropriate pattern which includes one or more open areas through which wirebond connections of the additional leadframe power conductor may be made to die level contact pads. To illustrate an example of such a patterned first leadframe power conductor 76, FIG. 6 depicts a plan view of the package assembly 60 depicted in FIG. 5. As depicted, the first leadframe power conductor 76 may be formed as a cross-hatched pattern of individual conductor lines that are positioned to be disposed over the entirety of the die surface 93 (including specifically the central or interior region) while providing openings to expose a plurality of die level contact pads 95 on both the peripheral and interior regions of the die surface 93. Of course, any desired pattern can be used to expose the die level contact pads 95 in the die surface 93, provided that the openings in the first leadframe power conductor 76 allow additional leadframe power conductors that are stacked over the first leadframe power conductor 76 to be wirebonded to the exposed die level contact pads 95.

Regardless of what pattern is used, the power will be distributed through the first leadframe power conductor 76 that is supplied from the package landings 75 (by virtue of the package landings 75 being connected through the carrier substrate 72 to the external reference voltage). As the current flows through the first leadframe power conductor 76 and toward the electrically connected die level bonding pads 98 in the interior region of the die surface 93, the current is divided across the individual conductive elements of the first leadframe power conductor 76. Thus, the current 101 provided from the lower left package landing 75 shown in FIG. 6 is divided into constituent current paths 102, each of which is in turn divided into constituent current paths 103. However, by virtue of the individual conductive elements of the first leadframe power conductor 76 being electrically connected to the die level bonding pads 98, the voltage drops across the die surface 93 are reduced, as compared to conventional approaches in which power lines are wirebonded to the die level bonding pads that are located on the periphery of the die surface 93.

Figure 7:
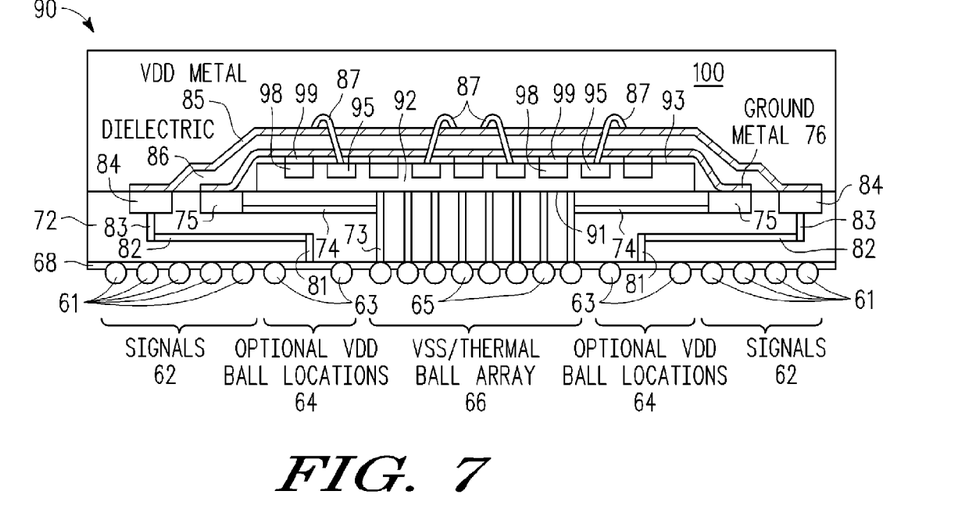
FIG. 7 illustrates a cross-sectional view of a wirebonded BGA package device in which a second layer of a multi-layer leadframe is affixed to a carrier substrate to provide power to die level bond pads distributed across the die area.
Figure 8:
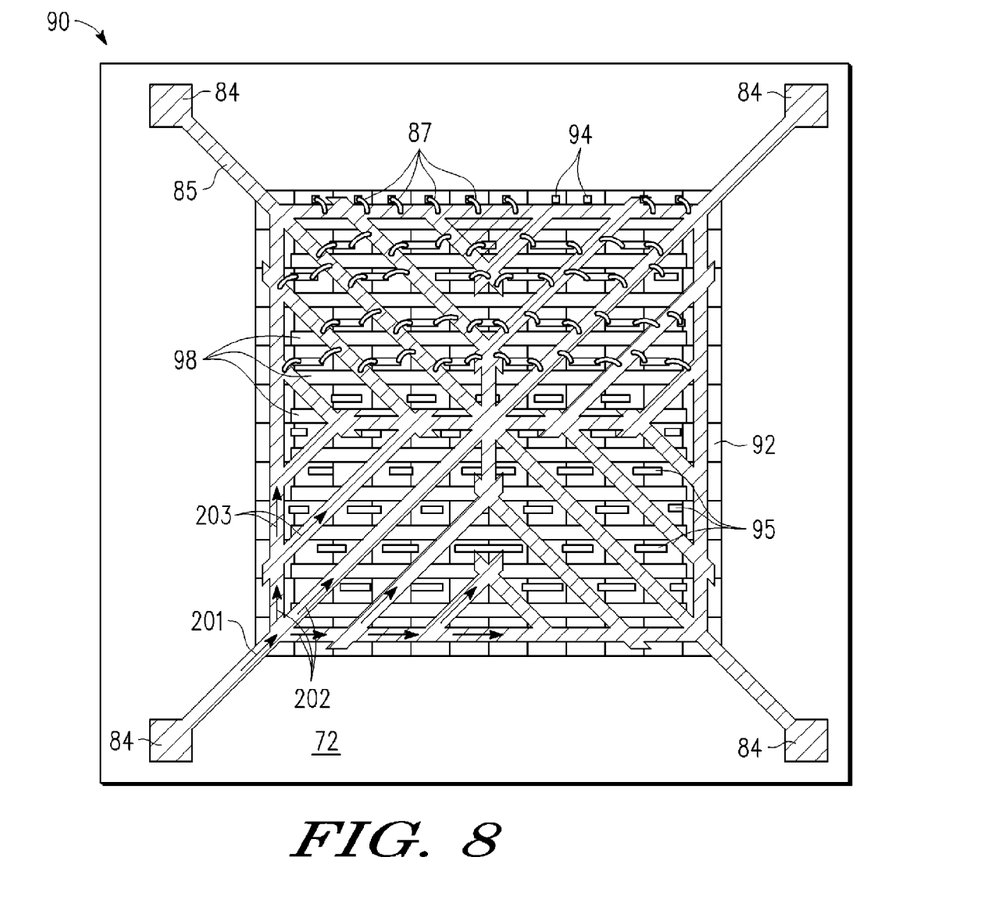
FIG. 8 illustrates a plan view of the package device depicted in FIG. 7.

An example of a stacked leadframe power conductor is illustrated in FIGS. 7 and 8, which depict a cross-sectional and plan view, respectively, of a wirebonded BGA packaging assembly 90 in which an integrated circuit 92, first leadframe power conductor 76 and second leadframe power conductor 85 are affixed to a carrier substrate 72 and encased in an insulating package body 100. The second leadframe power conductor 85 is positioned above the first leadframe power conductor 76 and separated therefrom by a dielectric material 86. Alternatively, the first and second leadframe power conductors may be constructed as a two-layer composite structure having a dielectric layer and two conductive layers laminated or formed together so as to position the dielectric layer between the two conductive layers which thereby serve as two layers of the leadframe power conductors. When positioned to extend across the entire die 92, the second leadframe power conductor 85 can be used to uniformly provide additional power (e.g., reference voltage $V_{DD}$) to all die level bond pads 95 on the die 92, including in the central or interior region. This may be accomplished by connecting a plurality of wirebond conductors 87 between the die level bond pads 95 and the second leadframe power conductor 85. In turn, the second leadframe power conductor 85 is physically and electrically connected to one or more package landings 84 formed in the carrier substrate 72 using any desired technique for making electrical contact. In turn, the package landings 84 are electrically connected through conductive vias and traces 81-83 and the $V_{DD}$ solder balls 63 to the external power source (e.g., $V_{DD}$).

To illustrate an example of how the second leadframe power conductor 85 is wirebonded to the die level bond pads 95, FIG. 8 depicts a plan view of the package assembly 90 depicted in FIG. 7. As depicted, the second leadframe power conductor 85 is patterned as a cross-hatched pattern of individual conductor lines and positioned to overlap with the first leadframe power conductor 76. With this arrangement, the first and second leadframe power conductors 76, 85 are positioned to be disposed over the entirety of the die surface 93 (including specifically the central or interior region) while providing openings to expose a plurality of die level contact pads 95 on both the peripheral and interior regions of the die surface 93. As will be appreciated, it is not necessary that the first and second leadframe power conductors 76, 85 overlap exactly, though the overlap should allow clear openings to be defined that expose the die level contact pads 95, especially in the central or interior region. Through these openings, the wirebond conductors 87 are positioned and attached to electrically connect the contact pads 95 and second leadframe power conductor 85. For purposes of simplifying the visual presentation, FIG. 8 shows only some of the wirebond conductors 87, though it will be appreciated that additional wirebond connections may be made to connect the contact pads 95 and second leadframe power conductor 85.

Through the second leadframe power conductor 85, the current from the package landings 84 will flow toward the wirebonded die level bonding pads 95 in the interior region of the die surface 93. As it flows, the current is divided across the individual conductive elements of the second leadframe power conductor 85 so that the current 201 provided from the lower left package landing 84 shown in FIG. 8 will be divided into constituent current paths 202, each of which is in turn divided into constituent current paths 203. However, by virtue of the individual conductive elements of the second leadframe power conductor 85 being electrically connected to the die level bonding pads 95, the voltage drops across the die surface 93 are reduced, as compared to conventional approaches in which power lines are wirebonded to the die level bonding pads that are located on the periphery of the die surface 93.

As will be appreciated, the stacked leadframe power conductor may include additional conductive layers stacked above the first and second leadframe power conductors, thereby allowing additional power levels to be supplied to the interior regions of the die surface 93. However many stacked leadframe power conductors are used, the openings defined therein are used to make wirebond contacts to the die level pads so that power can be applied across the die surface from the power conductors instead of from using die contact pads at the periphery to apply power to the central areas of the chip. In addition, the additional power conductor layers and the openings formed therein allow additional signal lines to be wirebonded to die level signal bond pads 94 at the periphery of the integrated circuit die 92. In selected embodiments, the perimeter region of the die surface is reserved for the die level signal bond pads 94 to which signal wirebonds are attached. Though not shown in the figures, this allows off-die signal wirebond conductor(s) (e.g., wires 56 shown in FIG. 4) to be attached to die level signal bond pads 94 in the perimeter region of the die 92 to the extent they are not displaced by inboard supply wires 87.

In an example assembly sequence, the integrated circuit die 92 is positioned and affixed to the carrier substrate 72, such as by using a die attach adhesive layer (not shown) or other suitable die attach technique. In addition, a first leadframe power conductor 76 is formed from one or more conductive layers, such as by selectively etching a conductive layer, stamping or screen printing the leadframe power conductor to form a plurality of openings. With the die 92 affixed, the first leadframe power conductor 76 is positioned and affixed to the carrier substrate 72 so that one or more proximal ends of the first leadframe power conductor 76 are aligned with corresponding package landing pads 75 formed in the carrier substrate 72. The first leadframe power conductor 76 may be electrically and physically connected to the package landing pads 75 using any desired technique for making electrical contact, such as using solder, conductive adhesive, thermocompressive bond, thermosonic bond or wirebond. At this point, the first leadframe power conductor 76 is also electrically and physically connected to die level bonding pads 98 by virtue of the die attach adhesive layers 99 previously formed in alignment with the bonding pads 98. On top of the first leadframe power conductor 76, a dielectric layer 86 is applied, either as part of the first leadframe power conductor 76, or as a separate dielectric layer. With the first leadframe power conductor 76 affixed, the second leadframe power conductor 85 is positioned and affixed to the carrier substrate 72 using any desired electrical contact technique so that one or more proximal ends of the second leadframe power conductor 85 are aligned with corresponding package landing pads 84 formed in the carrier substrate 72. At this point, the second leadframe power conductor 85 is also electrically connected to die level bonding pads 95 with wirebond conductors 87 which extend through openings defined in the first and second leadframe power conductors.

By now it should be appreciated that there has been provided a method for making a ball grid array package assembly. Under the method, a ball grid array carrier substrate is provided that has a plurality of reference voltage terminal package landing pads and a plurality of signal line package landing pads formed on a surface of the carrier substrate. In addition, an integrated circuit die is provided that has an active surface with an interior region (in which die level reference voltage supply terminals are located) and a peripheral region (in which die level signal terminals are located). In the integrated circuit, the die level reference voltage supply terminals are used to provide a reference voltage (e.g., ground, I/O $V_{DD}$, $V_{DD}$ or $V_{SS}$) to the circuit. The integrated circuit die is attached to the carrier substrate surface, such as by applying a die attach adhesive material to a portion of the carrier substrate surface and then attaching the integrated circuit die to the die attach adhesive material so that the active surface of the integrated circuit die is opposite (i.e., faces away from) the carrier substrate surface. After the integrated circuit die is attached, a first leadframe power conductor is attached to at least two of the reference voltage terminal package landing pads so that the first leadframe power conductor is electrically connected to the reference voltage terminal package landing pads and disposed over the interior region of the integrated circuit die. In addition, the first leadframe power conductor is electrically connected to the plurality of die level reference voltage supply terminals in the interior region of the integrated circuit die, such as by wirebonding the die level reference voltage supply terminals to the first leadframe power conductor with a plurality of wirebond conductors, or by applying a conductive die attach adhesive material to electrically connect the die level reference voltage supply terminals to the first leadframe power conductor. In selected embodiments, a second leadframe power conductor is affixed to at least two different reference voltage terminal package landing pads so that the second leadframe power conductor is electrically connected to the different reference voltage terminal package landing pads and disposed over the interior region of the integrated circuit die. The second leadframe power conductor may be affixed by stacking the second leadframe power conductor over the first leadframe power conductor, or by affixing the second leadframe power conductor in an open area defined by the first leadframe power conductor so that it does not overlap with the first leadframe power conductor. In this way, the first leadframe power conductor may be electrically connected to a first reference voltage and the second leadframe power conductor may be electrically connected to a second reference voltage. The plurality of signal line package landing pads are also wirebonded to the plurality of die level signal terminals on the integrated circuit die. At a subsequent point, the integrated circuit die and the leadframe power conductors are encapsulated to completely enclose the first leadframe power conductor.

In another form, there is provided ball grid array packaging assembly for packaging a semiconductor device. The package includes a carrier substrate having a first surface in which is formed a plurality of conductive bonding pads for supplying a reference voltage. The package also includes an integrated circuit having an active surface in which is formed a plurality of signal bonding pads and a plurality of reference voltage bonding pads distributed across an interior region of the active surface. As affixed, the active surface of the integrated circuit may be opposite the first surface of the carrier substrate. In addition, the package includes a patterned leadframe conductor disposed over the active surface of the integrated circuit and electrically connected (e.g., bonded) to the plurality of reference voltage bonding pads and the plurality of conductive bonding pads, thereby electrically coupling the integrated circuit to the carrier substrate. In selected embodiments, the patterned leadframe conductor is implemented with two patterned leadframe conductors, where a first patterned leadframe conductor is disposed over the active surface of the integrated circuit and electrically connected (e.g., bonded) to a first plurality of reference voltage bonding pads and a first plurality of conductive bonding pads, and where a second patterned leadframe conductor is disposed over the active surface of the integrated circuit and electrically connected (e.g., bonded) to a second plurality of reference voltage bonding pads and a second plurality of conductive bonding pads. As disclosed, the second patterned leadframe conductor may be positioned to overlap at least in part the first patterned leadframe conductor, or may be positioned adjacent to the first patterned leadframe conductor so that there is no overlap between the first and second patterned leadframe conductors. In other embodiments, the patterned leadframe conductor is implemented as a two-layer composite structure having a dielectric layer and two conductive layers formed together so as to position the dielectric layer between the two conductive layers, whereby each of the conductive layers is a patterned leadframe conductor. The ball grid array package may also include a plurality of wirebond connectors for electrically connecting a plurality of signal line package landing pads formed on the first surface of the carrier substrate to the plurality of signal bonding pads formed on the active surface of the integrated circuit. In the final assembly, the package includes an insulating package body which is affixed to the carrier substrate and completely encapsulates the patterned leadframe conductor and integrated circuit in the packaging assembly In yet another form, there is provided an integrated circuit device having an integrated circuit with an active surface in which is formed a plurality of reference voltage bonding pads distributed across an interior region of the active surface. The integrated circuit device includes a packaging structure for mounting and encapsulating the integrated circuit, where the packaging structure includes an encapsulated leadframe conductor disposed over the active surface of the integrated circuit and electrically connected to the plurality of reference voltage bonding pads across the interior region of the active surface.

Although the described exemplary embodiments disclosed herein are directed to various packaging assemblies and methods for making same, the present invention is not necessarily limited to the example embodiments which illustrate inventive aspects of the present invention that are applicable to a wide variety of packaging processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for making a package assembly comprising:
    providing a carrier substrate having a plurality of reference voltage terminal package landing pads and a plurality of signal line package landing pads formed on a first surface of the carrier substrate;
    attaching an integrated circuit die to the first surface of the carrier substrate where the integrated circuit die comprises an active surface having a plurality of die level reference voltage supply terminals and a plurality of die level signal terminals;
    affixing a conductive structure of a first leadframe power conductor to at least two of the reference voltage terminal package landing pads so that the conductive structure of the first leadframe power conductor is electrically connected to the reference voltage terminal package landing pads and disposed over an interior region of the integrated circuit die;
    electrically connecting the conductive structure of the first leadframe power conductor to the plurality of die level reference voltage supply terminals in the interior region of the integrated circuit die;
    encapsulating the integrated circuit die and first leadframe power conductor to completely enclose the first leadframe power conductor;
    wherein electrically connecting the conductive structure of the first leadframe power conductor to the plurality of die level reference voltage supply terminals comprises wirebonding the plurality of die level reference voltage supply terminals to the conductive structure of the first leadframe power conductor with a plurality of wirebond conductors prior to encapsulating the integrated circuit die.

2. The method of claim 1, where attaching the integrated circuit die to the first surface of the carrier substrate comprises attaching the integrated circuit die so that the active surface of the integrated circuit die faces away from the first surface of the carrier substrate.

3. The method of claim 1, further comprising wirebonding the plurality of signal line package landing pads to the plurality of die level signal terminals on the integrated circuit die prior to encapsulating the integrated circuit die.

4. The method of claim 1, further comprising affixing a second leadframe power conductor to at least two different reference voltage terminal package landing pads so that the second leadframe power conductor is electrically connected to the at least two different reference voltage terminal package landing pads and disposed over the interior region of the integrated circuit die.

5. The method of claim 4, where the conductive structure of the first leadframe power conductor is electrically connected to a first reference voltage and the second leadframe power conductor is electrically connected to a second reference voltage.

6. The method of claim 4, where affixing the second leadframe power conductor comprises stacking the second leadframe power conductor over the first leadframe power conductor.

7. The method of claim 4, where affixing the second leadframe power conductor comprises affixing the second leadframe power conductor in an open area defined by the first leadframe power conductor.

8. The method of claim 1, where electrically connecting the conductive structure of the first leadframe power conductor comprises electrically connecting the first leadframe power conductor to a plurality of die level ground supply terminals in the interior region of the integrated circuit die.

9. The method of claim 1, where electrically connecting the conductive structure of the first leadframe power conductor comprises electrically connecting the conductive structure of the first leadframe power conductor to a plurality of die level $V_{DD}$ supply terminals in the interior region of the integrated circuit die.

10. The method of claim 1, where electrically connecting the conductive structure of the first leadframe power conductor comprises electrically connecting the conductive structure of the first leadframe power conductor to a plurality of die level $V_{ss}$ supply terminals in the interior region of the integrated circuit die.

11. A packaging assembly-comprising:
a carrier substrate comprising a first surface and a plurality of conductive bonding pads located at the first surface for supplying a reference voltage;
an integrated circuit comprising an active surface with a plurality of signal bonding pads and a plurality of reference voltage bonding pads distributed across the active surface;
a patterned leadframe conductor disposed over the active surface of the integrated circuit and electrically connected to the plurality of reference voltage bonding pads and the plurality of conductive bonding pads thereby electrically coupling the integrated circuit to the carrier substrate; and
an insulating package body affixed to the carrier substrate so that the patterned leadframe conductor is completely encapsulated in the packaging assembly;
wherein the patterned leadframe conductor includes a conductive structure of a contiguous conductive material disposed over the active surface of the integrated circuit and extending outward from the integrated circuit and downward towards the carrier substrate and electrically connected to a first plurality of conductive bonding pads;
a plurality of wire bonds, each electrically connected and attached to a reference voltage bonding pad of a first plurality of reference voltage bonding pads and to the conductive structure of the patterned leadframe conductor.

12. The packaging assembly of claim 11, where the patterned leadframe conductor comprises:
a first patterned leadframe conductor disposed over the active surface of the integrated circuit and electrically connected to a first plurality of reference voltage bonding pads and a first plurality of conductive bonding pads, and
a second patterned leadframe conductor disposed over the active surface of the integrated circuit and electrically connected to a second plurality of reference voltage bonding pads and a second plurality of conductive bonding pads.

13. The packaging assembly of claim 12, where the second patterned leadframe conductor is positioned to overlap at least in part the first patterned leadframe conductor.

14. A packaging assembly-comprising:
a carrier substrate comprising a first surface and a plurality of conductive bonding pads located at the first surface for supplying a reference voltage;
an integrated circuit comprising an active surface with a plurality of signal bonding pads and a plurality of reference voltage bonding pads distributed across the active surface;
a patterned leadframe conductor disposed over the active surface of the integrated circuit and electrically connected to the plurality of reference voltage bonding pads and the plurality of conductive bonding pads thereby electrically coupling the integrated circuit to the carrier substrate; and
an insulating package body affixed to the carrier substrate so that the patterned leadframe conductor is completely encapsulated in the packaging assembly;
where the patterned leadframe conductor comprises:
a first patterned leadframe conductor disposed over the active surface of the integrated circuit and electrically connected to a first plurality of reference voltage bonding pads and a first plurality of conductive bonding pads, and
a second patterned leadframe conductor disposed over the active surface of the integrated circuit and electrically connected to a second plurality of reference voltage bonding pads and a second plurality of conductive bonding pads;
where the second patterned leadframe conductor is positioned adjacent to the first patterned leadframe conductor so that there is no overlap between the first and second patterned leadframe conductors.

15. A packaging assembly-comprising:
a carrier substrate comprising a first surface and a plurality of conductive bonding pads located at the first surface for supplying a reference voltage;
an integrated circuit comprising an active surface with a plurality of signal bonding pads and a plurality of reference voltage bonding pads distributed across the active surface;
a patterned leadframe conductor disposed over the active surface of the integrated circuit and electrically connected to the plurality of reference voltage bonding pads and the plurality of conductive bonding pads thereby electrically coupling the integrated circuit to the carrier substrate; and
an insulating package body affixed to the carrier substrate so that the patterned leadframe conductor is completely encapsulated in the packaging assembly;
where the patterned leadframe conductor comprises a two-layer composite structure having a dielectric layer and two conductive layers formed together so as to position the dielectric layer between the two conductive layers, whereby each of the conductive layers is a patterned leadframe conductor.

16. The packaging assembly of claim 11, where the active surface of the integrated circuit is opposite the first surface of the carrier substrate.

17. The packaging assembly of claim 11, further comprising a plurality of wirebond connectors for electrically connecting a plurality of signal line package landing pads formed on the first surface of the carrier substrate to the plurality of signal bonding pads formed on the active surface of the integrated circuit.

* * * * *